(12) United States Patent
Oikawa et al.

(10) Patent No.: US 6,643,203 B2
(45) Date of Patent: Nov. 4, 2003

(54) SEMICONDUCTOR MEMORY DEVICE INCLUDING CLOCK-INDEPENDENT SENSE AMPLIFIER

(75) Inventors: Kiyoharu Oikawa, Kawasaki (JP); Kimio Maruyama, Yokohama (JP); Yasuhiro Watanabe, Yokohama (JP); Naokazu Kuzuno, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/230,229

(22) Filed: Aug. 29, 2002

(65) Prior Publication Data

US 2003/0058719 A1 Mar. 27, 2003

(30) Foreign Application Priority Data

Sep. 27, 2001 (JP) .................................. 2001-298506

(51) Int. Cl.$^7$ ................................................ G11C 7/02
(52) U.S. Cl. .................. 365/207; 365/208; 365/189.09; 365/203; 365/195
(58) Field of Search ................................ 365/207, 208, 365/189.09, 203, 195

(56) References Cited

U.S. PATENT DOCUMENTS

| | | | | |
|---|---|---|---|---|
| 5,859,799 A | * | 1/1999 | Matsumoto et al. | ... 365/189.09 |
| 6,188,623 B1 | | 2/2001 | Morzano | |
| 6,205,071 B1 | * | 3/2001 | Ooishi | ........................ 365/207 |
| 6,351,423 B2 | * | 2/2002 | Ooishi | ........................ 365/207 |

\* cited by examiner

Primary Examiner—Richard Elms
Assistant Examiner—Nam Nguyen
(74) Attorney, Agent, or Firm—Oblon, Spivak, McClelland, Maier & Neustadt, P.C.

(57) ABSTRACT

A semiconductor memory device includes a memory cell array, a read control circuit, a row decoder, a column decoder, a sense amplifier, and a sense amplifier control circuit. The read control circuit produces a precharge signal to precharge a bit line of the memory cell array. The sense amplifier amplifies data read onto the bit line. In reading data from a memory cell, the sense amplifier control circuit enables the sense amplifier and inhibits entry of read data from a memory cell into the sense amplifier only for a fixed interval after a fixed time after the precharging signal has been negated. The sense amplifier control circuit allows entry of read data into the sense amplifier while the sense amplifier is being disabled.

19 Claims, 13 Drawing Sheets

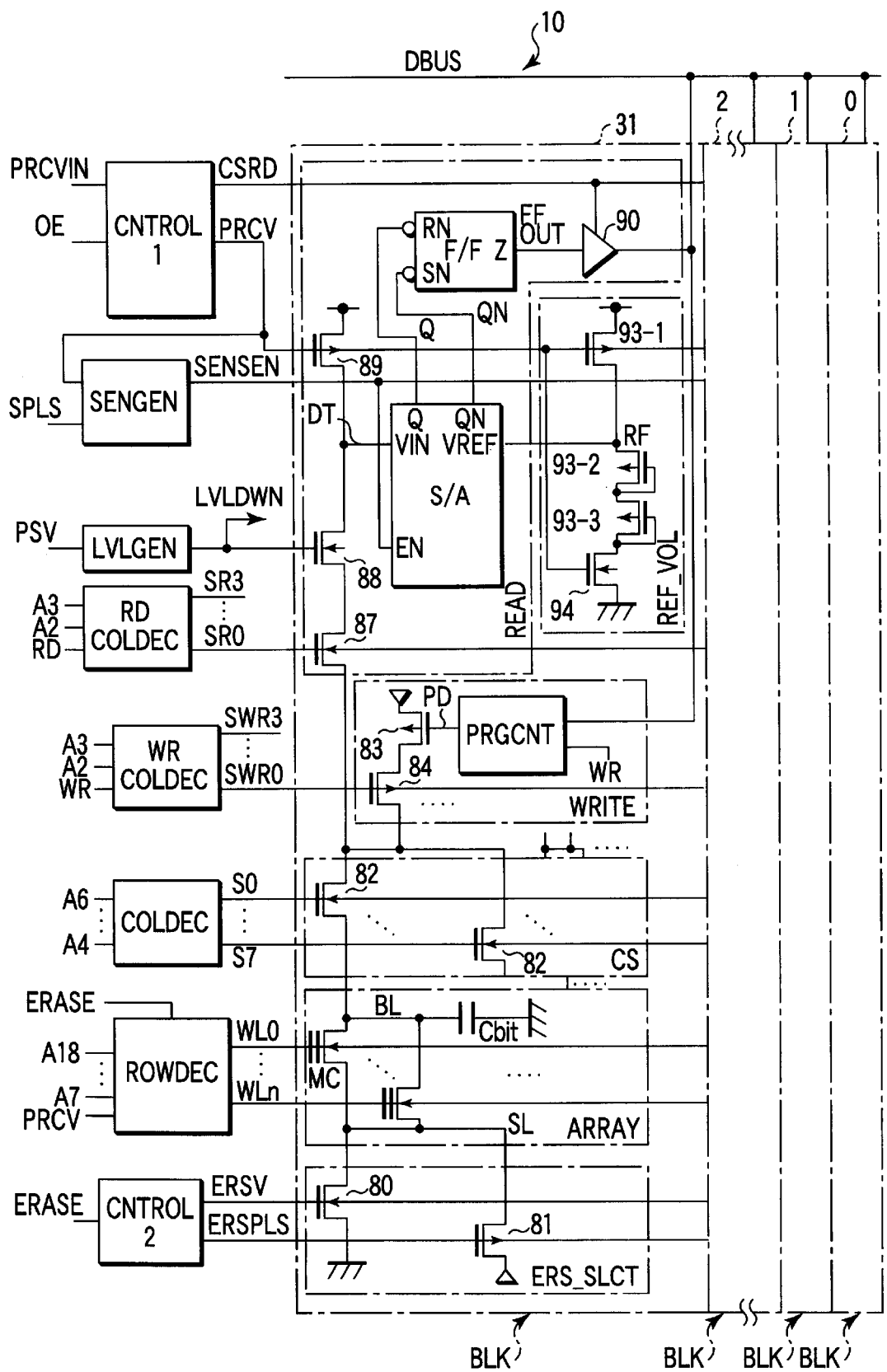
F I G. 4

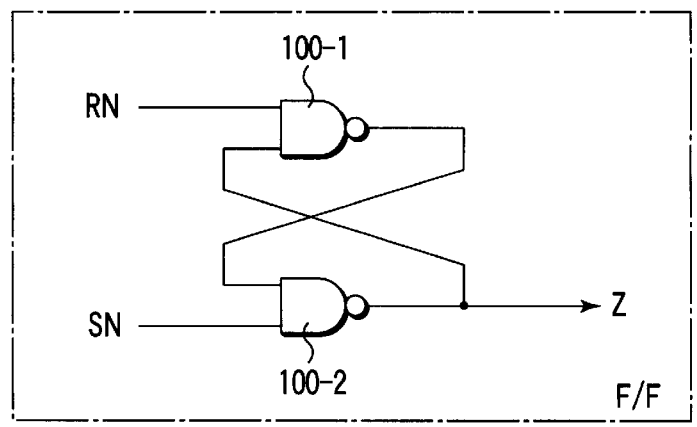
F I G. 5K
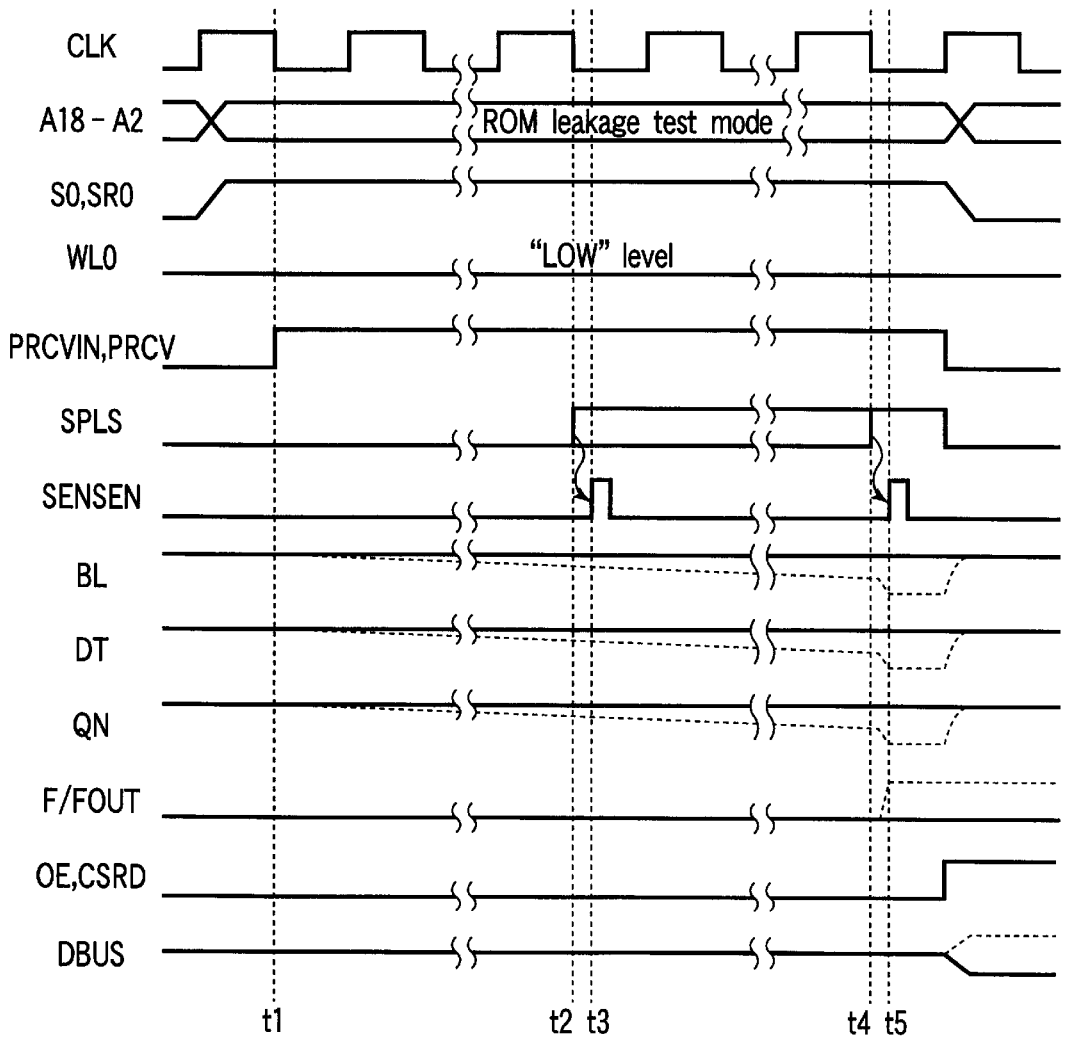
F I G. 6B

SEMICONDUCTOR MEMORY DEVICE INCLUDING CLOCK-INDEPENDENT SENSE AMPLIFIER

CROSS-REFERENCE TO THE RELATED APPLICATIONS

This application is based upon and claims the benefit of priority from the prior Japanese Patent Application No. 2001-298506, filed Sep. 27, 2001, the entire contents of which are incorporated herein by reference.

BACKGROUND OF THE INVENTION

1. Field of the Invention

The present invention relates to a semiconductor memory device. More specifically, the present invention relates to a techniques used in a leakage test for a semiconductor memory device such as a flash EEPROM (Electrically Erasable and Programmable Read Only Memory).

2. Description of the Related Art

In recent years, microcomputer systems embedded flash memory have been used. The flash memory embedded into a microcomputer operates in sync with the system clock that controls the microcomputer system.

The memory sense circuit system of a conventional clock-synchronous flash memory will be described using FIG. 1, which is a block diagram of that flash memory.

As shown, the flash memory, indicated at 200, includes a read control circuit CNTROL1, a level control circuit LVLGEN, a read column decoder RDCOLDEC, a write column decoder WRCOLDEC, a column decoder COLDEC, a row decoder ROWDEC, an erase control circuit CNTROL2, and 32 memory blocks BLK.

The read control circuit CNTROL1 is responsive to a system clock CLK, an address select signal ROMCS and an output enable signal OE, which are supplied from the CPU in the microcomputer, to output a precharge signal PRCV, a data latch clock signal ACT2, and an output control signal CSRD. The arrangement of the read control circuit CNTROL1 is illustrated in FIG. 2A. As shown, the read control circuit CONTROL1 comprises two NAND gates 300-1 and 300-2, two buffers 310-1 and 310-2, and two inverters 320-1 and 320-2. The NAND gate 300-1 performs a logical NAND operation on the address select signal ROMCS and the system clock CLK. The NAND gate 300-2 performs a logical NAND operation on the address select signal ROMCS and the inverse of the system clock CLK from the inverter 320-1. The precharge signal PRCV is the buffered signal of the output of the NAND gate 300-1 from the buffer 310-1. The data latch clock signal ACT2 is the inverse of the output signal of the NAND gate 300-2 from the inverter 320-2. The output control signal CSRD is the buffered signal of the output enable signal OE from the buffer 310-2.

The level control circuit LVLGEN is responsive to the control signal PSV to produce a level control signal LVLDWN.

The read column decoder RDCOLDEC is responsive to address signals A3 and A2 and a read signal RD to make a selection from four read column select lines SR0 to SR3.

The write column decoder WRCOLDEC is responsive to address signals A3, A2 and a write signal WR to make a selection from four write column select lines SWR0 to SWR3.

The column decoder COLDEC is responsive to address signals A6 to A4 to make a selection from eight column select lines S0 to S7.

The row decoder ROWDEC is responsive to address signals A18 to A7 to make a selection from (n+1) word lines WL0 to WLn.

The erase control circuit CNTROL2 is responsive to an erase signal ERASE to produce erase signals ERSV and ERSPLS.

The memory block BLK includes a memory cell array ARRAY, a column selector CS, an erase switching circuit ERS_SLCT, a write control circuit PRGCNT, a write circuit WRITE, a read circuit READ, and a reference voltage generating circuit REF_VOL.

The memory cell array ARRAY has memory cells (flash cells) MC arrayed in a matrix form. The memory cells have their gates connected to the word lines WL0 to WLn and their sources connected together to a common source line SL, which in turn is connected to the erase switching circuit ERS_SLCT. The drains (bit lines BL) of the memory cells are connected to the column selector CS.

The erase switching circuit ERS_SLCT operates based on the erase signals ERSV and ERSPLS from the erase control circuit CONTROL2 and drives the source line to a high potential at the time of erasing memory cells and to ground potential otherwise.

The column selector CS is responsive to signals on the column select lines S0 to S7 to select one of the bit lines BL.

The write circuit WRITE has a write control circuit PRGCNT, a write transistor 210, and a number of select transistors 220. The write control circuit PRGCNT is responsive to a write signal WR from the CPU and write data carried to a data bus DBUS to output a write control signal PD. The transistor 210 is a pMOS transistor having its gate supplied with the write control signal PD and its source connected to a high-potential voltage source. Though only one is shown, the select transistors 220 have their gates connected to the write column select lines SWR0 to SWR3, their sources connected to the drain of the write transistor 210 and their drains connected to bit lines BL selected by the column selector CS. At write operation, a potential corresponding to write data is applied to a bit line BL selected by the column selector CS and the select transistor 220.

The read circuit READ has a plurality of select transistors 230, a bias control transistor 240, a bit-line precharging transistor 250, a sense amplifier S/A, a latch circuit LD, and a buffer 260. Though only one is illustrated, the select transistors 230 have their gates connected to the column select lines SR0 to SR3 and their sources connected to bit lines BL selected by the column selector CS. The bias control transistor 240 has its gate connected to receive the level control signal LVLDWN from the level control circuit LVLGEN and its source connected to a bit line selected by the select transistors 230 (the drains of the transistors 230). The bit line precharging transistor 250 has its gate connected to receive the precharge signal PRCV from the read control circuit CNTROL1, its source connected to a power supply and its drain connected to the drain of the bias control transistor 240 (bit line). The node between the drains of the transistors 240 and 250 is connected to an input terminal VIN of the sense amplifier S/A. The circuit arrangement of the sense amplifier S/A will be described with reference to FIG. 2B.

As shown, the sense amplifier S/A is a current mirror type of sense amplifier having two pMOS transistors 400-1 and 400-2, three nMOS transistors 410-1 to 410-3, and an inverter 420. The sense amplifier is enabled when the control signal PSV input to its enable terminal EN is asserted.

The reference voltage generating circuit REF_VOL applies a reference voltage RF to a reference voltage input terminal VREF of the sense amplifier S/A. The reference voltage generating circuit REF_VOL includes, as shown, three pMOS transistors 270-1 to 270-3 and one nMOS transistor 280. The transistor 280 is turned on when the control signal PSV is asserted, i.e., raised to a high level. As a result, a fixed reference voltage RF determined by the transistors 270-2 and 270-3 is applied to the sense amplifier S/A.

The latch circuit LD is responsive to a data latch clock signal ACT2 to hold read data VDATA output from the output terminal VOUT of the sense amplifier S/A.

The buffer 260 holds read data LDT from the latch circuit LD and responds to an output control signal CSRD output from the read control circuit CNTROL1 to output the data onto the data bus DBUS.

The read operation of the flash memory thus configured will be described next with reference to a timing diagram of FIG. 3A.

First, the CPU in the microcomputer outputs address signals A18 to A2 synchronously with the system clock CLK. The address signals identify all locations on the microcomputer including the flash memory. When the address signals are decoded and identify the flash memory 200, the address select signal ROMCS is asserted (driven to the high level). The read control circuit CNTROL1 performs a logical NAND operation on the clock CLK and the address select signal ROMCS to produce the precharge signal PRCV. Based on the address signals A6 to A2, the read column decoder RDCOLDEC selects one of the read column select lines SR0 to SR3 and the column decoder COLDEC selects one of the column select lines S0 to S7 (time t1). A bit line BL selected in this manner is charged to a precharge level during the interval when the precharge signal PRCV is asserted (dropped to a low level) and consequently the precharging transistor 250 is turned on. At time t2, the precharging of the bit line terminates. The row decoder ROWDEC selects one of the word lines WL0 to WLn based on the address signals A18 to A7 (time t2). Then, data stored in the memory cell selected by the row decoder ROWDEC and the column decoders COLDEC and RDCOLDEC is read out on to the bit line BL, changing the bit line potential. The read data on the bit line is input to the sense amplifier S/A as an input signal DT. The control signal PSV is set at a fixed potential all the time. Thus, the reference voltage generating circuit REF VOL supplies the reference potential RF to the sense amplifier S/A all the time. The sense amplifier S/A is placed in the enabled state by the control signal PSV. The sense amplifier S/A outputs an output signal VDATA, which is an amplified read data DT, to the latch circuit LD. During the interval when the data latch clock signal ACT2 is asserted, that is, during the interval when the clock CLK is at low level and the address select signal ROMCS is at high level (the interval from time t2 to time t3), the latch circuit LD latches the signal VDATA.

In order to output the data read onto the bit line BL during the interval from t2 to t3 onto the data bus DBUS, the output enable signal OE and the read control signal CSRD are asserted (driven to the high level) at time t3. Thus, the output signal LDT of the latch circuit LD is output onto the data bus DBUS through the buffer 260.

Next, a leakage test of the flash memory configured as described above will be described with reference to FIG. 3B, which is a timing diagram of signals in the leakage test operation.

The operation at the leakage test mode is basically the same as the aforementioned operation at the data read mode. At the leakage test operation, the word line WL0 is set to be non-selected. A decision is made as to the presence or absence of leakage, depending on whether the potential on the precharged bit line BL keeps or falls below the precharge level. In FIG. 3B, broken lines indicate waveforms in the presence of leakage in the bit line. That is, the presence of leakage results in the inversion of an original signal being output onto the data bus DBUS, thereby allowing the presence of leakage to be found. In this case, it is required to set the frequency of the clock CLK low enough to allow the bit line potential to fall through leakage.

With the conventional flash memory described above, however, a delay of the data latch clock signal ACT2 may result in abnormal data being output. That is, the address select signal ROMCS suffers some delay because it is produced by decoding the address signals A18 to A2. As shown in FIG. 3A as well, therefore, the address select signal ROMCS may rise Δt1 behind time t1 and fall Δt2 behind time t3. During the interval from t3 to t3+Δt2, the precharge signal PRCV is asserted (driven to the low level) because the clock CLK is high and the address select signal ROMCS is high. For this reason, the bit line BL is also precharged during the interval of Δt2 immediately after time t3. In such a situation, if the falling of the data latch clock signal ACT2 is delayed, that is, if the signal ACT2 falls with a delay of Δt3 from time t3 in FIG. 3A, data on the bit line BL precharged during the interval of Δt2 will also be latched by the latch circuit LD. As a result, not only original data read onto the bit line BL during the interval from t2 to t3 but also false data precharged during the interval from t3 to t3+Δt3 may be output onto the data bus DBUS.

With the conventional flash memory, the power consumption tends to increase because the sense amplifier S/A is enabled all the time. As described previously, the sense amplifier S/A is always placed in the enabled state by the control signal PSV. Since the sense amplifier is enabled, for example, for a bit line precharge interval during which time it does not need to be enabled, the power consumption of the flash memory increases.

Moreover, the conventional flash memory may require a very long time for a leakage test. In the first place, the leakage current is a very low current. Thus, it takes a very long time for the bit line potential to fall enough through leakage. For this reason, it is required to set the frequency of the clock CLK sufficiently low at the leakage test operation. However, the clock CLK is not used for the flash memory only but used to control the operation of the entire microcomputer system. Therefore, changing the clock frequency only for the purpose of a leakage test of the flash memory is very troublesome and may result in a long test time.

BRIEF SUMMARY OF THE INVENTION

A semiconductor memory device according to an aspect of the present invention comprises: a memory cell array having an array of a plurality of memory cells;
    a read control circuit which produces a precharging signal to precharge a bit line of the memory cell array;
    a row decoder which selects a word line of the memory cell array;
    a column decoder which selects the bit line of the memory cell array;
    a sense amplifier which amplifies data read from a memory cell selected by the row decoder and the column decoder to the bit line; and
    a sense amplifier control circuit which is responsive to the precharging signal to control the sense amplifier, in reading data from a memory cell, the sense amplifier control circuit enabling the sense amplifier and inhibiting entry of read data from the memory cell into the sense amplifier only for a fixed interval after a fixed time after the precharging signal has been negated and allowing entry of the read data into the sense amplifier while the sense amplifier is being disabled.

BRIEF DESCRIPTION OF THE SEVERAL VIEWS OF THE DRAWING

FIG. 4 is a block diagram of a flash memory according to an embodiment of the present invention;

FIG. 5K is a circuit diagram showing a flip-flop of the flash memory according to the embodiment of the present invention;

FIG. 6B is a timing chart showing respective signals at a leakage test operation of the flash memory according to the embodiment of the present invention;

DETAILED DESCRIPTION OF THE INVENTION

A semiconductor memory device according to an embodiment of the present invention will be described in terms of a flash EEPROM embedded into microcomputer system. FIG. 4 is a block diagram of such a flash memory.

As shown, the flash memory, indicated at 10, includes a read control circuit CNTROL1, a sense amplifier control circuit SENGEN, a level control circuit LVLGEN, a read column decoder RDCOLDEC, a write column decoder WRCOLDEC, a column decoder COLDEC, a row decoder ROWDEC, an erase control circuit CNTROL2, and 32 memory blocks BLK.

Figure 1:
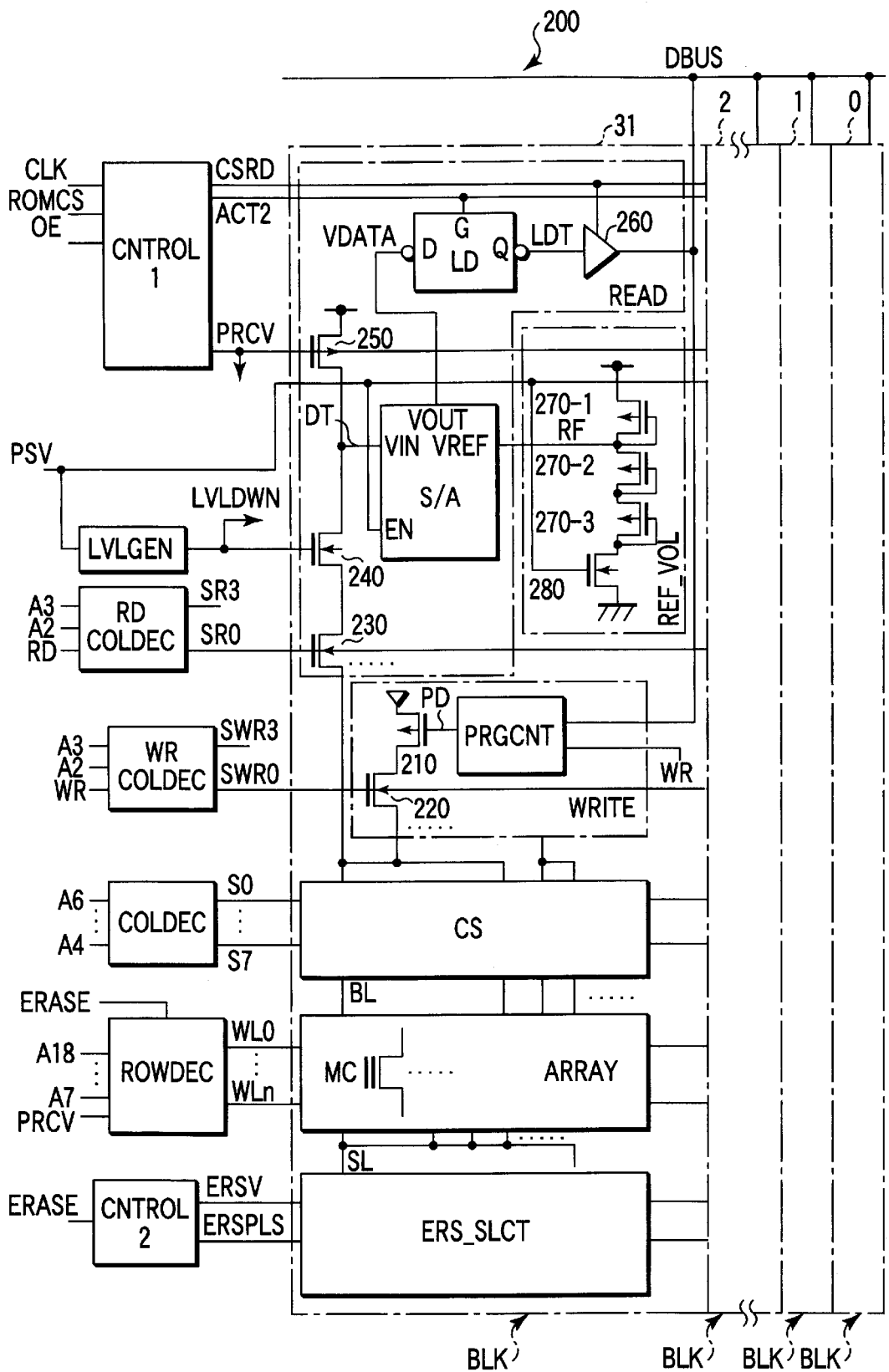
FIG. 1 is a block diagram showing a conventional flash memory.
Figure 2A:
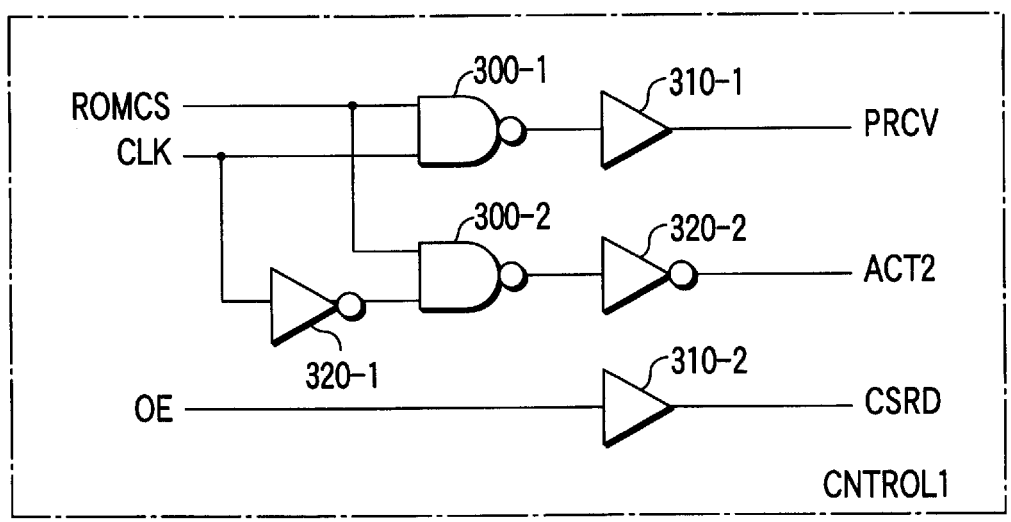
FIG. 2A is a circuit diagram showing a control circuit of the conventional flash memory.
Figure 2B:
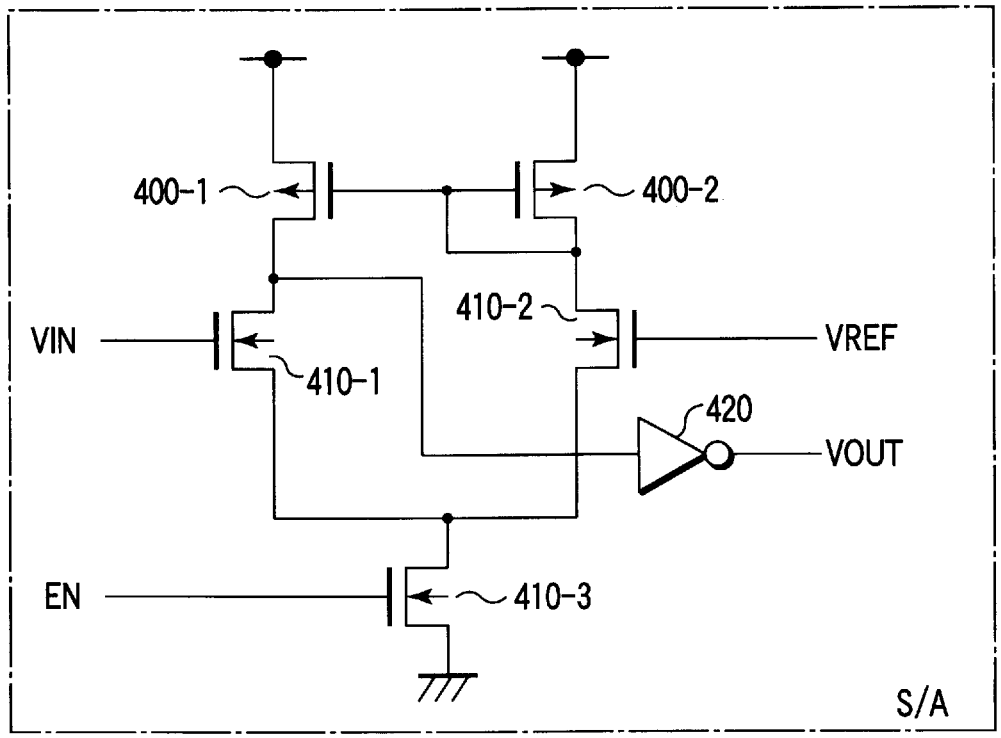
FIG. 2B is a circuit diagram showing a conventional sense amplifier of the conventional flash memory.
Figure 3A:
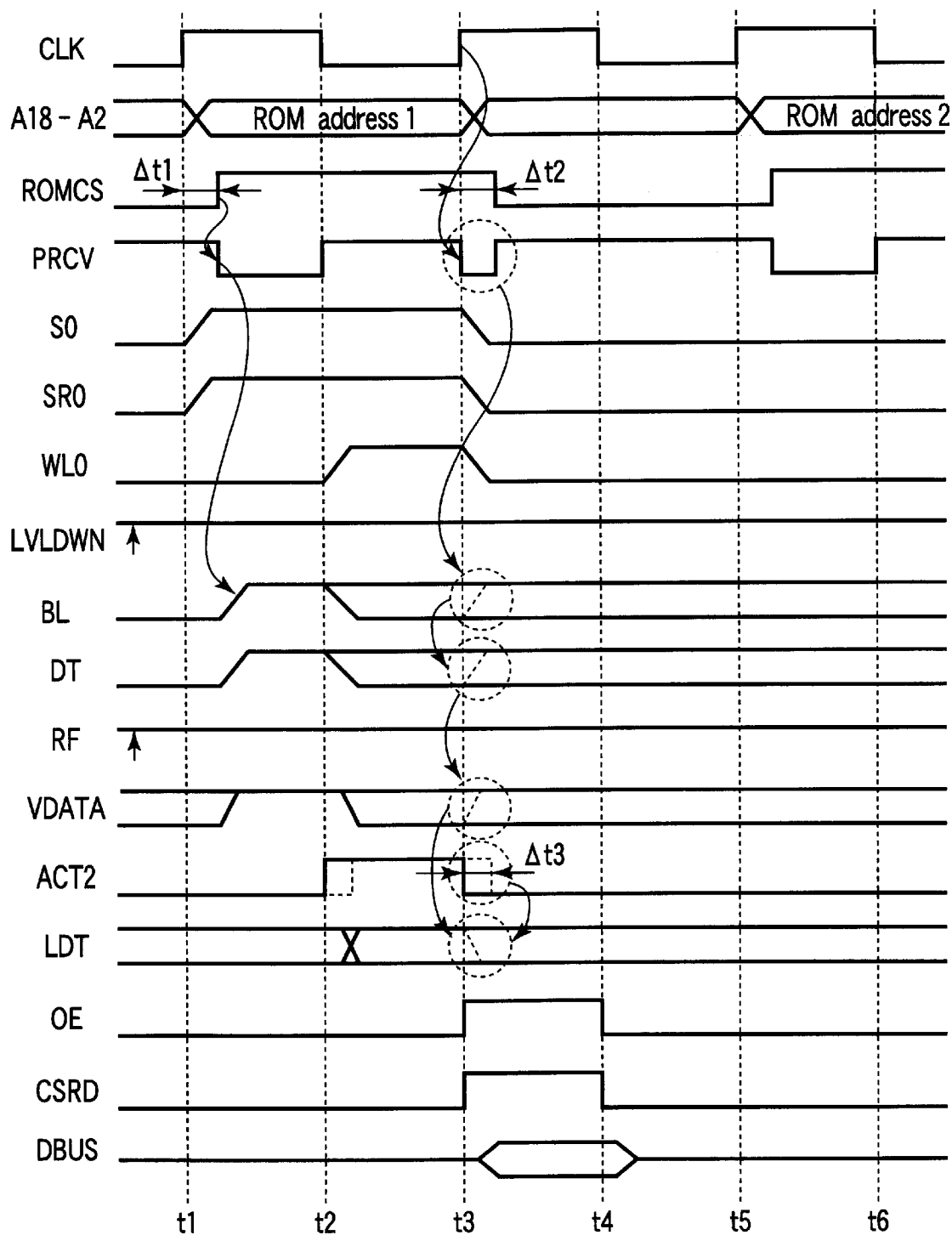
FIG. 3A is a timing chart showing respective signals at a read operation of the conventional flash memory.
Figure 3B:
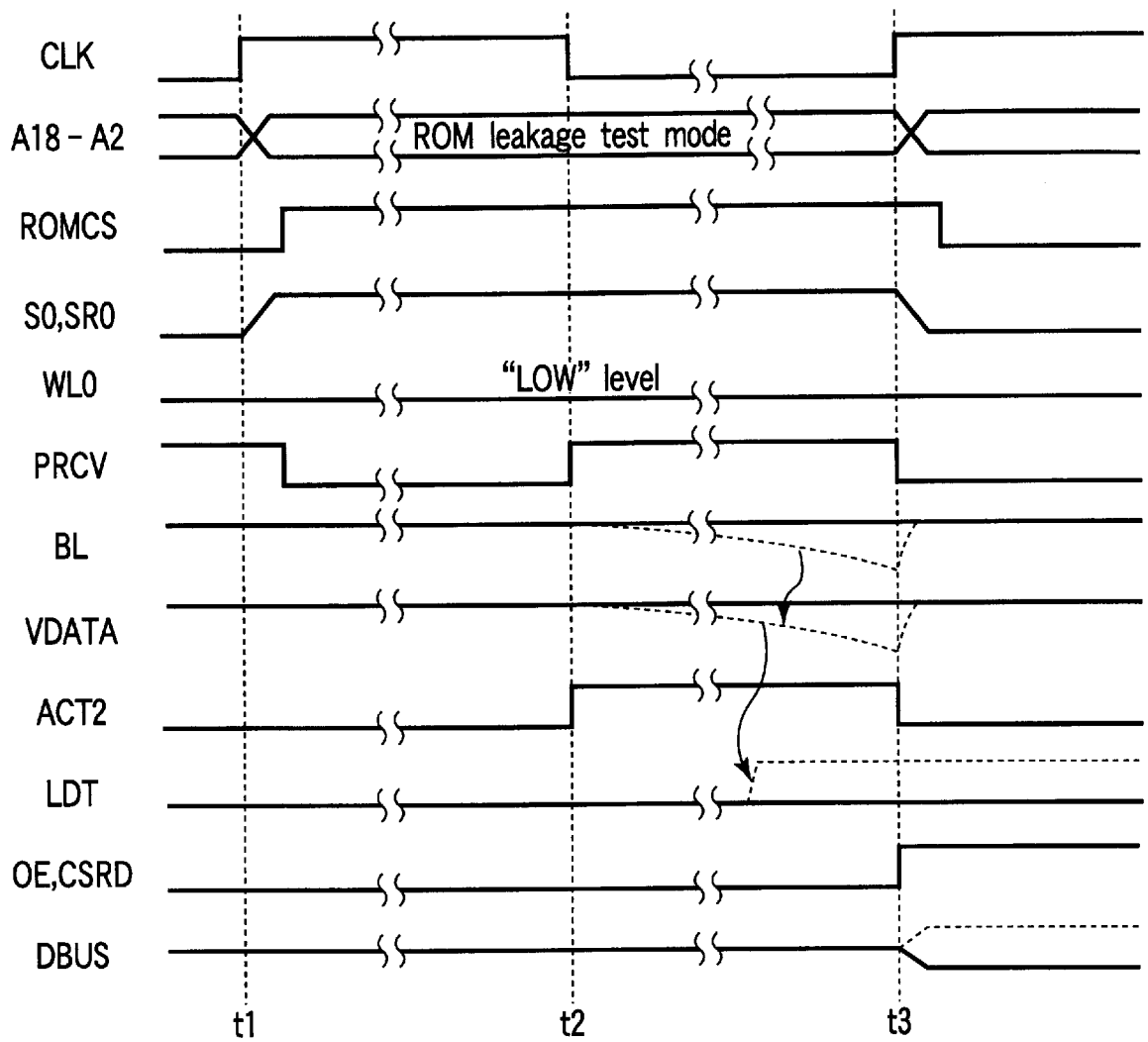
FIG. 3B is a timing chart showing respective signals at a leakage test of the conventional flash memory.
Figure 5A:
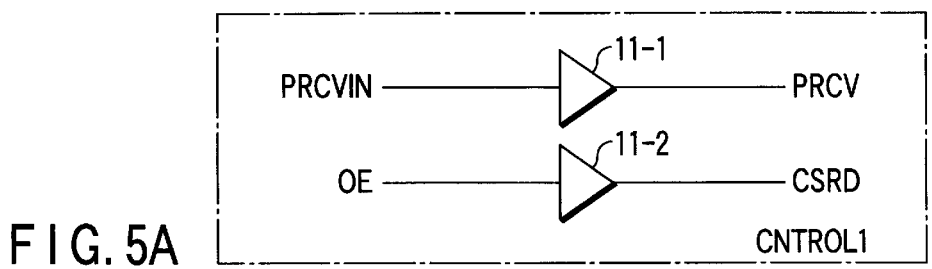
FIG. 5A is a circuit diagram showing a read control circuit of the flash memory according to the embodiment of the present invention.

The read control circuit CNTROL1 is responsive to a precharge signal PRCVIN and an output enable signal OE, which are supplied from the outside of the flash memory (for example, from the CPU in the microcomputer), to output a precharge signal PRCV and an output control signal CSRD. The arrangement of the read control circuit CNTROL1 is illustrated in FIG. 5A. As shown, the read control circuit CNTROL1 comprises two buffers 11-1 and 11-2. The precharge signal PRCV is the buffered signal of the precharge signal PRCVIN. The output control signal CSRD is the buffered signal of the output enable signal OE.

Figure 5B:
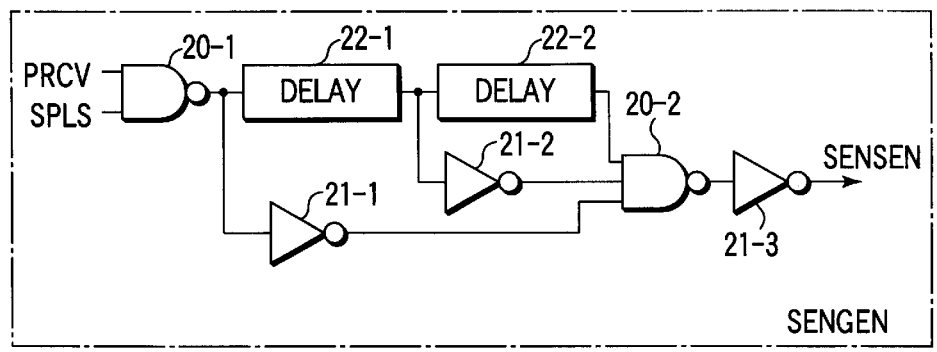
FIG. 5B is a circuit diagram showing a sense amplifier control circuit of the flash memory according to the embodiment of the present invention.

The sense amplifier control circuit SENGEN is responsive to the precharge signal PRCV from the read control circuit CNTROL1 and an externally input leakage test signal SPLS to produce a sense amplifier enable signal SENSEN. The arrangement of the sense amplifier control circuit SENGEN is illustrated in FIG. 5B. As shown, the sense amplifier control circuit SENGEN comprises NAND gates 20-1 and 20-2, first, second and third inverters 21-1, 21-2 and 21-3, and first and second delay circuits 22-1 and 22-2. Each of the delay circuits 22-1 and 22-2 includes an even number of delay stages each delaying a signal. The NAND gate 20-1 performs a NAND logical operation on the precharge signal PRCV and the leakage test signal SPLS. The output signal of the NAND gate 20-1 is input to the delay circuit 22-1 and the inverter 21-1. The delayed signal from the delay circuit 22-1 is input to the delay circuit 22-2 and the inverter 21-2. The NAND gate 20-2 performs a NAND logical operation on the outputs of the delay circuit 22-2 and the inverters 21-1 and 21-2. The output signal of the NAND gate 20-2 is inverted by the inverter 21-3 to provide the sense amplifier enable signal SENSEN. In the normal operation of the flash memory, the leakage test signal SPLS is always set high.

Figure 5C:
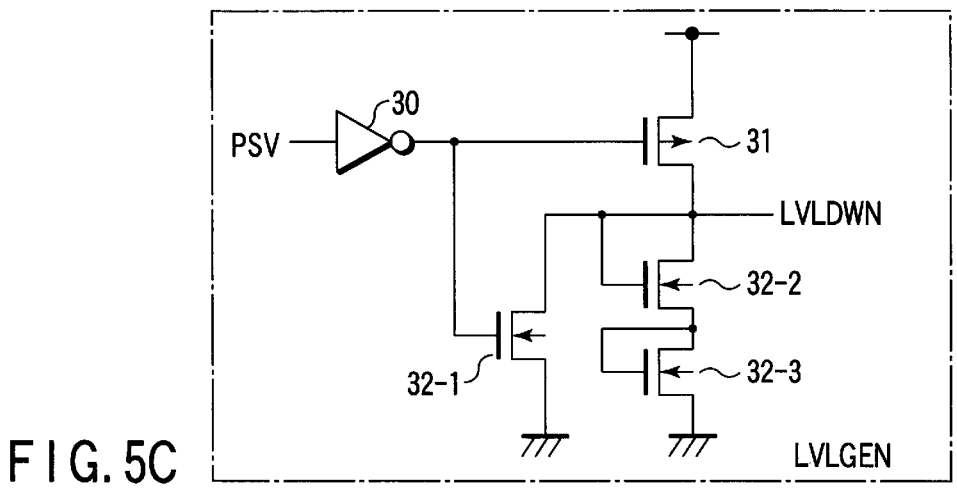
FIG. 5C is a circuit diagram showing a level control circuit of the flash memory according to the embodiment of the present invention.

The level control circuit LVLGEN is responsive to a control signal PSV to output a level control signal LVLDWN. The arrangement of the level control circuit LVLGEN is illustrated in FIG. 5C. As shown, the level control circuit LVLGEN comprises an inverter 30, a pMOS transistor 31, and nMOS transistors 32-1, 32-2 and 32-3. The control signal PSV input to the level control circuit LVLGEN is inverted by the inverter 30 and then input to the gates of the transistors 31 and 32-1. The transistor 31 has its source connected to a power supply and its drain connected to the output terminal of the level control circuit LVLGEN to output a level control signal LVLDWN. The transistor 32-1 has its source connected to ground and its drain connected to the drain of the transistor 31. The transistor 32-2 has its gate and drain connected together to the drain of the transistor 31. The transistor 32-3 has its gate and source connected together to the source of the transistor 32-2 and its source connected to ground.

Figure 5D:
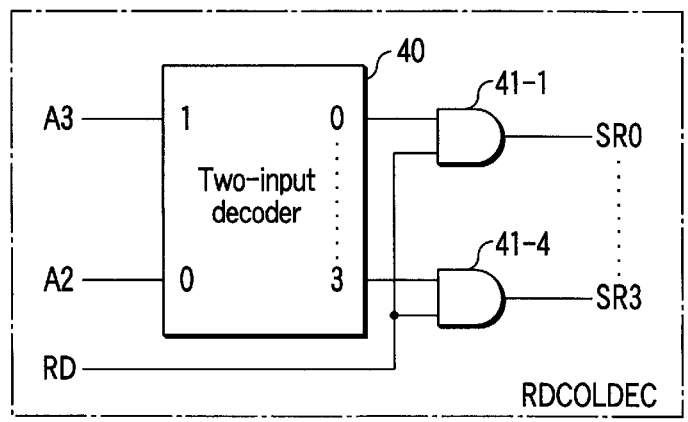
FIG. 5D is a circuit diagram showing a read column decoder of the flash memory according to the embodiment of the present invention.

The read column decoder RDCOLDEC is responsive to address signals A3 and A2 (read column address signals) and a read signal RD to select one of read column select lines SR0 to SR3. The arrangement of the column decoder RDCOLDEC is illustrated in FIG. 5D. As shown, the read column decoder RDCOLDEC comprises a two-input decoder 40 and four AND gates 41-1 to 41-4 (in the drawing, only two AND gates 41-1 and 41-4 are depicted). The decoder 40 decodes the address signals A3 and A2 to provide four column address decoded signals. Each of the AND gates 41-1 to 41-4 performs a logical AND operation on a corresponding one of the column address decoded signals and the read signal RD. The outputs of the AND gates 41-1 to 41-4 are coupled to the column select lines SR0 to SR3, respectively.

Figure 5E:
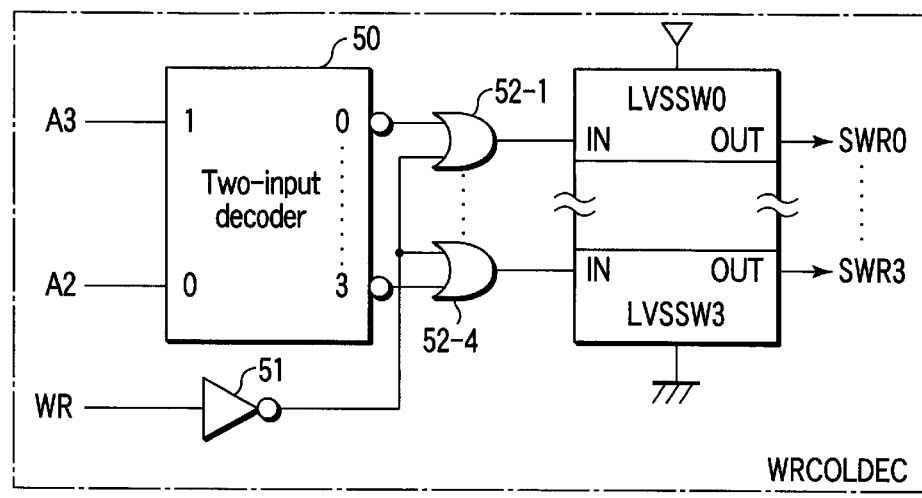
FIG. 5E is a circuit diagram showing a write column decoder of the flash memory according to the embodiment of the present invention.

The write column decoder WRCOLDEC is responsive to address signals A3 and A2 (write column address signals) and a write signal WR to select one of write column select lines SWR0 to SWR3. The arrangement of the column decoder WRCOLDEC is illustrated in FIG. 5E. As shown, the write column decoder WRCOLDEC comprises a two-input decoder 50, an inverter 51, four OR gates 52-1 to 52-4 (in the drawing, only two OR gates 52-1 and 52-4 are depicted), and four level shifters LVSSW0 to LVSSW3 (in the drawing, only two level shifters LVSSW0 and LVSSW3 are shown). The decoder 50 decodes the address signals A3 and A2 to provide four column address decoded signals. Each of the OR gates 52-1 to 52-4 performs a logical OR operation on a corresponding one of the inverted signals of the column address decoded signals and the inverted signal of the write signal WR from the inverter 51. Each of the level shifters LVSSW0 to LVSSW3 shifts the output level of a corresponding one of the OR gates 52-1 to 52-4. The outputs of the level shifters LVSSW0 to LVSSW3 are coupled to the write column select lines SWR0 to SWR3, respectively.

Figure 5F:
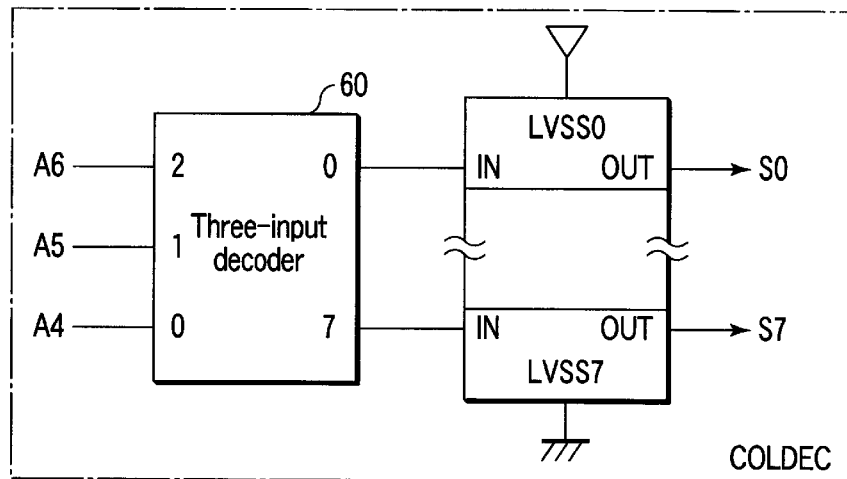
FIG. 5F is a circuit diagram showing a column decoder of the flash memory according to the embodiment of the present invention.

The column decoder COLDEC is responsive to address signals A6, A5 and A4 (column address signals) to select one of column select lines S0 to S7. The arrangement of the column decoder COLDEC is depicted in FIG. 5F. As shown, the column decoder COLDEC comprises a three-input decoder 60 and eight level shifters LVSS0 to LVSS7 (in the drawing, only two level shifters LVSS0 and LVSS7 are shown). The decoder 60 decodes the address signals A6 to A4 to provide eight column address decoded signals. Each of the level shifters LVSS0 to LVSS7 shifts the output level of a corresponding one of the column address decoded signals. The outputs of the level shifters LVSS0 to LVSS7 are coupled to the column select lines S0 to S7, respectively.

Figure 5G:
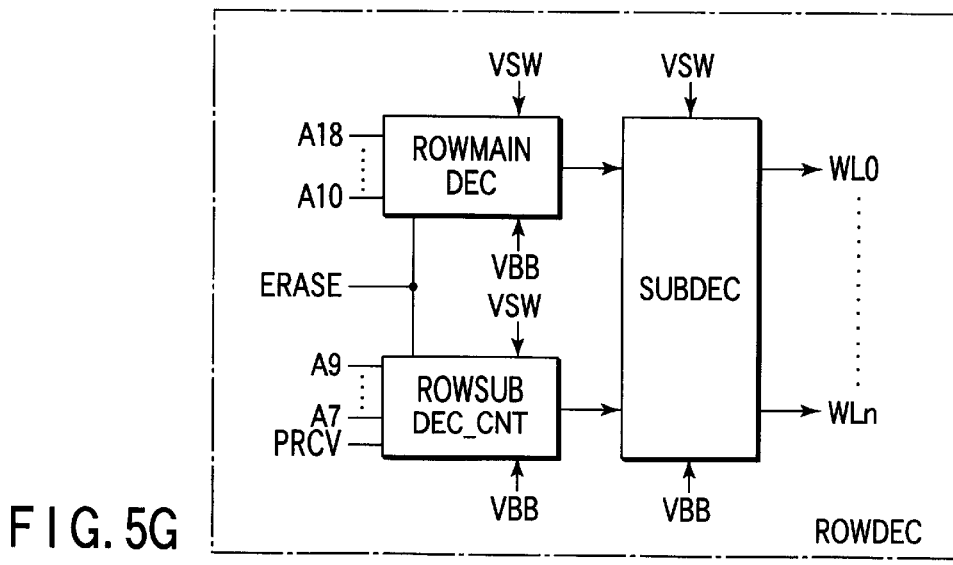
FIG. 5G is a circuit diagram showing a row decoder of the flash memory according to the embodiment of the present invention.

The row decoder ROWDEC is responsive to address signals A18 to A10 and A9 to A7 (row address signals), an erase signal ERASE and the precharge signal PRCV to select one of (n+1) word lines WL0 to WLn. The arrangement of the row decoder ROWDEC is depicted in FIG. 5G. As shown, the row decoder ROWDEC comprises a row main decoder ROWMAINDEC, a row sub-decoder control circuit ROWSUBDEC_CNT, and a sub-decoder SUBDEC. The row main decoder ROWMAINDEC decodes the address signals A18 to A10. The row sub-decoder control circuit ROWSUBDEC_CNT decodes the address signals A9 to A7. The sub-decoder SUBDEC decodes output signals of the row main decoder ROWMAINDEC and the row sub-decoder control circuit ROWSUBDEC_CNT and has its outputs connected to the word lines WL0 to WLn.

Figure 5H:
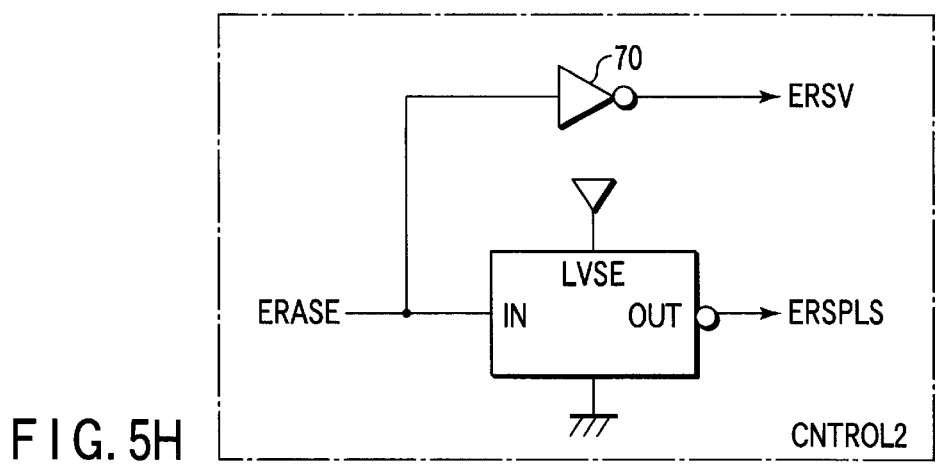
FIG. 5H is a circuit diagram showing a erase control circuit of the flash memory according to the embodiment of the present invention.

The erase control circuit CNTROL2 is responsive to the erase signal ERASE to output erase signals ERSV and ERSPLS. The arrangement of the erase control circuit is illustrated in FIG. 5H. As shown, the erase control circuit CNTROL2 comprises an inverter 70 and a level shifter LVSE. The erase signal ERASE is inverted by the inverter 70 to provide the erase signal ERSV. The erase signal ERASE is level shifted and then inverted in the level shifter LVSE to output the erase signal ERSPLS.

The memory block BLK includes a memory cell array ARRAY, a column selector CS, an erase switching circuit ERS_SLCT, a write control circuit PRGCNT, a write circuit WRITE, a read circuit READ, and a reference voltage generating circuit REF_VOL.

The memory cell array ARRAY has memory cells (flash cells) MC arrayed in a matrix form. The memory cells have their gates connected to the word lines WL0 to WLn and their sources connected together to a common source line SL, which in turn is connected to the erase switching circuit ERS_SLCT. The drains (bit lines BL) of the memory cells are connected together to the column selector CS in units of (n+1) memory cells having their gates connected to the word lines WL0 to WLn, respectively.

The erase switching circuit ERS_SLCT provides a potential to the common source line of the memory cell array ARRAY and comprises an nMOS transistor 80 and a pMOS transistor 81. The nMOS transistor 80 has its gate supplied with the erase signal ERSV, its drain connected to the common source line SL, and its source connected to ground. The pMOS transistor 81 has its gate supplied with the erase signal ERSPLS, its drain connected to a high-voltage power supply, and its source connected to the common source line SL. The transistors 80 and 81 operate in response to the erase signals ERSV and ERSPLS. At the operation of erasing memory cell data, the transistor 81 is turned on and the transistor 80 is turned off, providing a high potential to the common source line SL; otherwise, the transistor 80 is turned on and the transistor 81 is turned off, thereby connecting the common source line SL to ground potential.

The column selector CS is responsive to signals on the column select lines S0 to S7 to select one of the bit lines BL. The column selector CS comprises nMOS column select transistors 82 including their gates connected to the column select lines S0 to S7 and their drains connected to the bit lines BL. Every eight column select transistors 82 each having its gate connected to a respective one of the column select lines S0 to S7 have their sources connected together. The column selector CS comprises four blocks of eight column select transistors 82 that are connected to one another at drains.

Figure 5I:
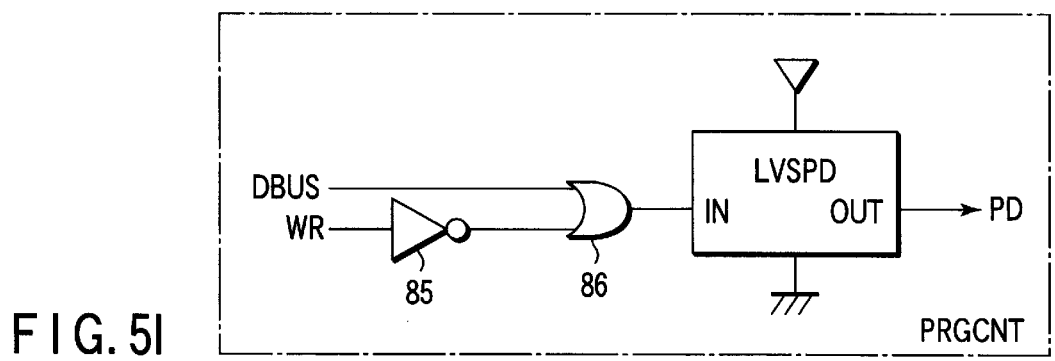
FIG. 5I is a circuit diagram showing a write control circuit of the flash memory according to the embodiment of the present invention.

The write circuit WRITE is responsive to the write signal WR and write data to apply a writing potential to a selected bit line BL, at write operation. The write circuit WRITE comprises a write control circuit PRGCNT, a pMOS write transistor 83, and four nMOS select transistors 84. The write control circuit PRGCNT is responsive to the write signal WR from the CPU and write data on the data bus DBUS to output a write control signal PD. The write control circuit PRGCNT comprises, as shown in FIG. 5I, an inverter 85, an OR gate 86, and a level shifter LVSPD. The write signal WR is inverted by the inverter 85. The OR gate 86 performs a logical OR operation on the write data on the data bus DBUS and the inverted write signal /WR. The output signal of the OR gate 86 is level shifted by the level shifter LVSPD to form the write control signal PD, which is in turn applied to the gate of the write transistor 83 having its source connected to the high power supply potential and its drain connected to the sources of the four select transistors 84. Each of the four select transistor 84 has its gate connected to the write column select lines SWR0 to SWR3 and its drain connected to the common drain line (bit line BL) of a respective one of four blocks each having eight column select transistors 82 in the column selector CS.

The read circuit READ amplifies data read onto the selected bit line at read operation and outputs it onto the data bus DBUS. The read circuit READ comprises four nMOS select transistors 87, an nMOS bias control transistor 88, a pMOS bit line precharging transistor 89, a sense amplifier S/A, a flip-flop F/F and a buffer 90.

The four select transistors 87 (in the drawing, only one is illustrated) have their gates connected to the read column select lines SR0 to SR3, respectively, and their sources connected to the common drain lines (bit lines) of the respective blocks each having eight column select transistors 82 in the column selector CS. The bias control transistor 88 has its gate applied with the level control signal LVLDWN from the level control circuit LVLGEN and its source connected to a bit line BL selected by a select transistor 87 (the drain of that select transistor). The bit line precharging transistor 89 has its gate applied with the precharge signal PRCV from the read control circuit CNTROL1, its source connected to the power supply potential, and its drain connected to the drain of the bias control transistor 88. The node between the bias control transistor 88 and the bit line precharging transistor 89 is connected to the input terminal VIN of the sense amplifier S/A.

The sense amplifier S/A amplifies read data DT input to its input terminal VIN and provides output signals at its output terminals Q and QN. The enable terminal is connected to receive the sense amplifier enable signal SENSEN from the sense amplifier control circuit SENGEN. The reference voltage input terminal VREF is connected to receive the reference voltage RF from the reference voltage generating circuit REF_VOL. The circuit arrangement of the sense amplifier S/A will be described with reference to FIG. 5J.

Figure 5J:
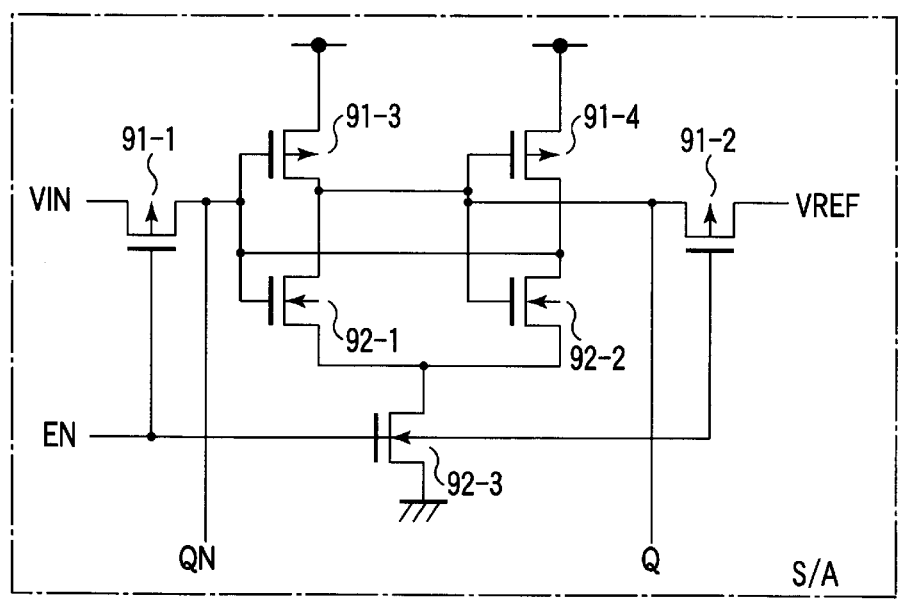
FIG. 5J is a circuit diagram showing a sense amplifier of the flash memory according to the embodiment of the present invention.

As shown in FIG. 5J, the sense amplifier S/A comprises four pMOS transistors 91-1 to 91-4 and three nMOS transistors 92-1 to 92-3. The pMOS transistor 91-3 (first transistor) has its gate connected to the gate of the nMOS transistor 92-1, its source connected to the power supply potential, and its drain connected to the drain of the nMOS transistor 92-1. The nMOS transistor 92-1 (second transistor) has its source connected to the drain of the nMOS transistor 92-3 (switching transistor). The nMOS transistor 92-3 has its gate connected to the enable terminal EN and its source connected to ground potential. The pMOS transistor 91-4 (third transistor) has its gate connected to the gate of the nMOS transistor 92-2, its source connected to the power supply potential, and its drain connected to the drain of the nMOS transistor 92-2. The nMOS transistor 92-2 (fourth transistor) has its source connected to the drain of the nMOS transistor 92-3. The common gates of the pMOS transistor 91-3 and the nMOS transistor 92-1 are connected to the common drains of the pMOS transistor 91-4 and the nMOS transistor 92-2. Likewise, the common gates of the pMOS transistor 91-4 and the nMOS transistor 92-2 are connected to the common drains of the pMOS transistor 91-3 and the nMOS transistor 92-1. The pMOS transistor 91-1 (first transfer gate transistor) has its gate connected to the enable terminal EN, its source connected to the input terminal VIN, and its drain connected to the common gates of the transistors 91-3 and 92-1. The pMOS transistor 91-2 (second transfer gate transistor) has its gate connected to the enable terminal EN, its source connected to the reference voltage input terminal VREF, and its drain connected to the common gates of the transistors 91-4 and 92-2. The drains of the transistors 91-1 and 91-2 are connected to the output terminals QN and Q, respectively. The sense amplifier S/A is placed in the enabled state by asserting the sense amplifier enable signal SENSEN. The sense amplifier S/A in the enabled state amplifies data read out of memory cells and outputs the amplified from its output terminal QN in amplified form. On the other hand, the output terminal Q provides signals corresponding to the reference voltage RF.

The reference voltage generating circuit REF_VOL comprises, as shown in FIG. 4, three pMOS transistors 93-1 to 93-3 and an nMOS transistor 94. The pMOS transistor 93-1 has its gate connected to receive the precharge signal PRCV output from the read control circuit CNTROL1 and its source connected to the power supply potential. The pMOS transistor 93-2 has its drain and gate connected together and its source connected to the drain of the pMOS transistor 93-1. The pMOS transistor 93-3 has its drain and gate connected together and its source connected to the drain of the pMOS transistor 93-2. The nMOS transistor 94 has its gate connected to receive the precharge signal PRCV output from the read control circuit CNTROL1, its drain connected to the drain of the pMOS transistor 93-3, and its source connected to ground potential. The reference potential RF is obtained at the node between the drain of the pMOS transistor 93-1 and the source of the pMOS transistor 93-2. In the circuit thus arranged, the transistor 94 is turned on by negating the precharge signal PRCV (raising the precharge signal to the high level), providing the reference voltage RF determined by the transistors 93-2 and 93-3 to the sense amplifier S/A. When the precharge signal PRCV is asserted (at the low level) (during the bit line precharge period), the circuit supplies the sense amplifier with the power supply potential (for example, VDD).

The inverted signals of the output signals Q and QN of the sense amplifier S/A are input to input terminals RN and SN, respectively, of the flip-flop F/F. The arrangement of the flip-flop F/F is depicted in FIG. 5K. As shown, the flip-flop F/F is an RS-F/F having two NAND gates 100-1 and 100-2. The NAND gate 100-1 performs a logical NAND operation on the signal Q applied to the reset input terminal RN and the output signal of the NAND gate 100-2. The NAND gate 100-2 performs a logical NAND operation on the inverted signal of the read data QN applied to the set input terminal SN and the output signal of the NAND gate 100-1. The output terminal of the NAND gate 100-2 is connected to the output terminal Z of the flip-flop F/F. From the output terminal Z, the memory cell read data is output as F/FOUT.

The buffer 90 holds the read data F/FOUT from the flip-flop F/F and outputs onto the data bus DBUS in response to the output control signal CSRD from the read control circuit CNTROL1.

Figure 6A:
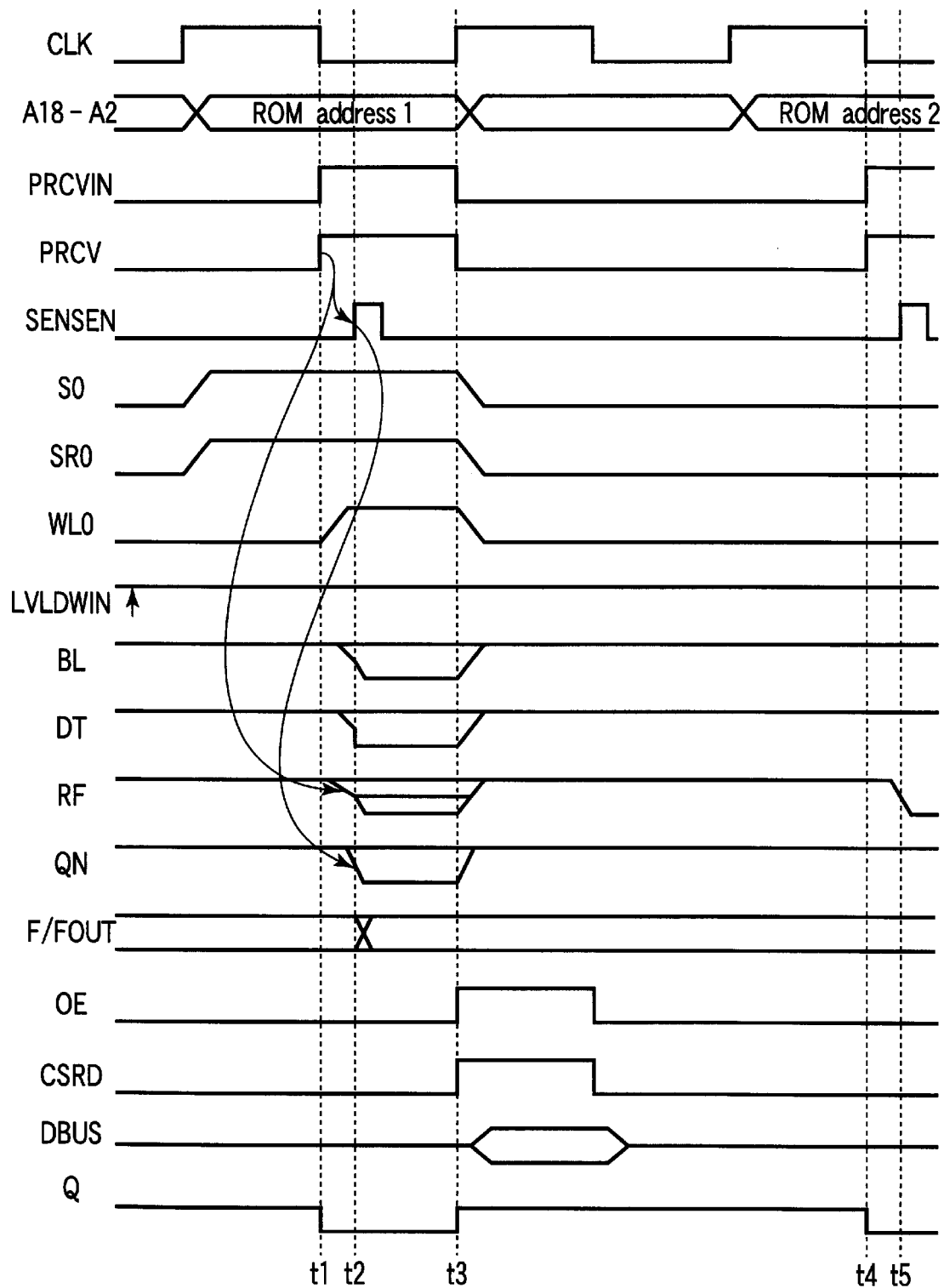
FIG. 6A is a timing chart showing respective signals at a read operation of the flash memory according to the embodiment of the present invention.

The read operation of the flash memory thus configured will be described with reference to a timing diagram of FIG. 6A.

First, the CPU in the microcomputer outputs the address signals A18 to A2 synchronously with the system clock CLK. These address signals are used to identify all the addresses on the microcomputer including the flash memory. The precharge signal PRCVIN to precharge the bit lines BL of the flash memory is input from the CPU. The precharge signal PRCVIN, which is the same as the conventionally used one, is produced, for example, by performing a logical AND operation on an address select signal ROMCS and the inverted clock /CLK.

Before t=t1, since the precharge signal PRCV is asserted (at the low level), the precharging transistor 89 has been turned on. Thus, the bit lines BL have been precharged. On the other hand, the nMOS transistor 94 has been turned off. The reference voltage generating circuit REF VOL has been disabled, outputting a predetermined voltage (for example, VDD). The sense amplifier S/A has also been disabled because the sense amplifier enable signal SENSEN is negated. Under such conditions, the read column decoder RDCOLDEC and the column decoder COLDEC select, for example, the read column select line SR0 (one of SR0 to SR3) and the column select line S0 (one of S0 to S7), respectively, according to the column address signals A6 to A2.

Next, at time t=t1, the precharge signal PRCV is negated (raised to the high level), the precharging transistor 89 is turned off. The row decoder ROWDEC selects the word line WL0 (one of WL0 to WLn) according to the row address signals A18 to A7. Then, data stored in a memory cell selected by the row decoder ROWDEC and the column decoder COLDEC, RDCOLDEC is read onto a bit line BL. As a result, the potential on that bit line is changed from the precharged level according to the stored data. The read data on the bit line BL is input to the sense amplifier S/A as an input signal DT. The nMOS transistor 94 is also turned on. Therefore, the reference voltage generating circuit REF_VOL is enabled, outputting the reference voltage RF determined by the nMOS transistors 93-2 and 93-3.

The control circuit SENGEN asserts the sense amplifier enable signal SENSEN at time t2 after a predetermined time after time t1 at which the precharge signal PRCV went to the high level. In the sense amplifier control circuit SENGEN shown in FIG. 5B, when the precharge signal PRCV goes to the high level, the output of the NAND gate 20-1 goes to the low level. This low-level output is input to the NAND gate 20-2 through the delay circuits 22-1 and 22-2, through the delay circuit 22-1 and the inverter 21-2, and through the inverter 21-1. As a result, the sense amplifier enable signal SENSEN goes to the high level at time t2 with the delay time of the delay circuit 22-1 after time t1 and then falls to the low level after a delay caused by the delay circuit 22-2. That is, the sense amplifier enable signal SENSEN is produced in the form of a one-shot pulse which is asserted only for the interval corresponding to the delay time of the delay circuit 22-2. Since the sense amplifier enable signal SENSEN is at the low level until time t2, the nMOS transistor 92-3 in the sense amplifier S/A shown in FIG. 5J is turned off and hence the sense amplifier is placed in the disabled state. On the other hand, the pMOS transistors 91-1 and 91-2 having their gates connected to receive the sense amplifier enable signal at the low level are in the on state. Thus, the data read onto the bit line BL and the reference voltage RF are being applied to the sense amplifier S/A via the pMOS transistors 91-1 and 91-2, respectively.

When the sense amplifier enable signal SENSEN goes to the high level at time t2, the nMOS transistor 92-3 is turned on, whereby the sense amplifier S/A is enabled. On the other hand, the pMOS transistors 91-1 and 91-2 are turned off, thus inhibiting the read data DT and the reference voltage RF from being applied to the sense amplifier S/A. In this state, the sense amplifier S/A performs an amplifying operation based on the reference voltage RF to output the result of amplification as the output signal QN. The reference voltage RF is output as the output signal Q.

The output signals QN and Q of the sense amplifier S/A are input with inversion to the set and reset input terminals SN and RN, respectively, of the flip-flop F/F. The output signal QN input to the set input terminal is output from the flip-flop F/F as the output signal F/FOUT.

In order to output the read data amplified in the sense amplifier at time t2 onto the data bus DBUS, the output enable signal OE and the read control signal CSRD are asserted (raised to the high level) at time t3. Thus, the output signal F/FOUT of the flip-flop F/F is output onto the data bus DBUS via the buffer 90.

Next, the leakage test operation of the flash memory will be described with reference to a timing diagram of FIG. 6B.

The operation at leakage test is the same basically to the read operation described above. At leakage test, however, the word line WL0 is placed in non-selected state and the leakage test signal SPLS is fixed at the low level. In addition, the precharge signal PRCV has been set low until time t1, so that the bit lines BL have been charged to the precharge level. After that, the precharge signal PRCV is fixed at the high level at time t1, discharging the bit lines BL. In the presence of leakage, the potential on the bit line BL should drop from the precharged level as indicated by broken lines in FIG. 6B. The leakage test signal SPLS is set high at time t2 by way of example. Then, the condition that PRCV=SPLS=high is satisfied. Therefore, as described above in the read operation, the sense amplifier enable signal SENSEN is temporarily set high at time t3, allowing the sense amplifier S/A to be enabled. In the example of FIG. 6B, since the potential on the bit line BL has not dropped enough at time t3, the output signal read onto the data bus DBUS remains unchanged. Assume that the leakage test signal SPLS is set high at time t4 that the potential on the bit line BL has already dropped enough and as a result the sense amplifier enable signal SENSEN is raised to the high level at time t5. Then, the potential on the bit line BL at time t5 is amplified and output by the sense amplifier S/A, whereby the inverse of the original signal will appear on the data bus DBUS. As a result, the presence of leakage can be found.

As described above, the flash memory according to this embodiment is provided with the sense amplifier control circuit SENGEN, which produces the sense amplifier enable signal SENSEN in the form of a one-shot pulse which is independent of the system clock CLK. The operation of the sense amplifier S/A is controlled by the sense amplifier enable signal SENSEN. At normal operation time, the sense amplifier enable signal SENSEN is produced based on the precharge signal PRCV and the leakage test signal SPLS which is fixed at a constant level (the high level) all the time. The conventionally used data latch clock signal ACT2 is disused. As a result, the sense amplifier S/A can be prevented from taking in abnormal data by the delay of the sense amplifier operation control signal (the sense amplifier enable signal SENSEN in this embodiment). Once the sense amplifier S/A is enabled, it is disabled against the entry of data on the bit line BL. Thus, the sense amplifier S/A, after having being enabled, is not affected by the data on the bit line BL. As a result, the malfunction of the sense amplifier can be prevented. Since the sense amplifier enable signal SENSEN is asserted only for a short interval as with a one-shot pulse, the power consumption of the sense amplifier can be minimized.

In the configuration of the sense amplifier S/A according to this embodiment, the pMOS transistor 91-4 acts as a pull-up transistor when the sense amplifier is disabled. That is, when the memory cell data is a 1, the potential on the bit line BL will go to the low level. In the sense amplifier S/A, since the nMOS transistor 92-3 is off, the potential at the node between the pMOS transistor 91-3 and the nMOS transistor 92-1 is unstable. Under such a situation, the pMOS transistor 91-4 cannot be perfectly placed in the off state, supplying a very low current. As a result, there arises the effect of raising the voltage at the input terminal VIN to a fixed potential through a voltage drop from the source to the drain of the pMOS transistor 91-4. Thus, the stabilization of the read operation of the flash memory can be effected.

Furthermore, in the configuration according to this embodiment, the reference voltage generating circuit REF_VOL, which, in the conventional circuit, is always placed in the operating state, is controlled by the precharge signal PRCV. That is, the reference voltage generating circuit REF_VOL is placed in the operating state when the bit line BL, after being precharged, is discharged. In other words, the reference voltage generating circuit REF_VOL is placed in the operating state immediately before the sense amplifier S/A is enabled. Thus, the power consumption can be reduced by operating the reference voltage generating circuit REF_VOL only when necessary.

Moreover, in the configuration according to this embodiment, the signal amplified by the sense amplifier S/A is held by the RS flip-flop. That is, the sense amplifier S/A is configured to output the read data signal QN and the reference voltage-based signal Q as shown in FIG. 5J and the conventional latch circuit is replaced by an RS flip-flop. In view of the characteristic of the RS flip-flop, its output F/FOUT depends on the input signal QN to the set input terminal SN. Even when input signals to the set and reset input terminals SN and RN go to the high level at the same time, the flip-flop holds the previous state. Thus, stabilization of output signals onto the data bus DBUS can be improved.

In addition, in the configuration according to this embodiment, the read timing at leakage test mode can be set freely by the leakage test signal SPLS. That is, as described above, the read operation (the enabled state of the sense amplifier S/A) is controlled by the sense amplifier enable signal SENSEN. If one of the precharge signal PRCV and the leakage test signal SPLS is fixed at the high level, the sense amplifier enable signal SENSEN is determined only by the other. Thus, in a state where the precharge signal PRCV is fixed at the high level and the leakage test signal SPLS is fixed at the low level, asserting the leakage test signal SPLS after a sufficient time has elapsed allows a leakage test to be made. As a result, there is no need of lowering the frequency of the system clock CLK in order to wait for the potential on the bit line BL to drop enough due to leakage. That is, it is necessary only to change the timing of asserting the leakage test signal SPLS with the frequency of the system clock CLK kept as it is at normal operation, allowing time and labor to change the system clock frequency for a leakage test to be saved and the leakage test for a flash memory to be simplified. In addition, the time required for a leakage test can be reduced.

Figure 7:
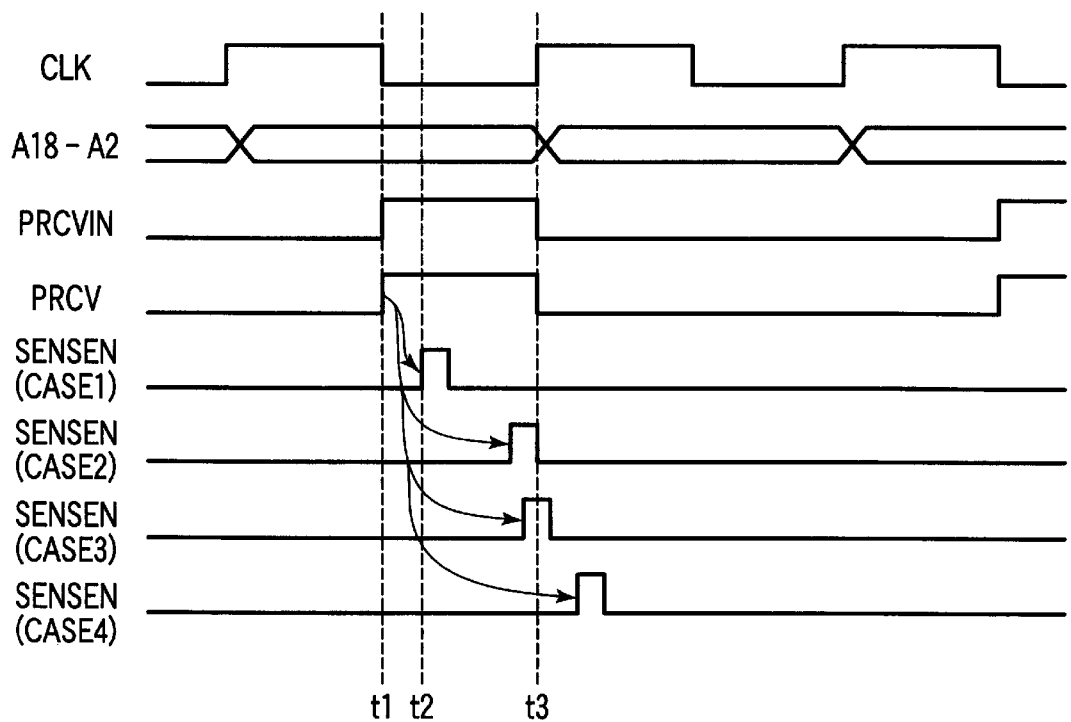
FIG. 7 is a timing chart showing respective signals at a read operation of a flash memory according to a modification of the embodiment of the present invention.

FIG. 7 is a timing diagram for a read operation of a flash memory according to a modification of the embodiment. In FIG. 7, only the system clock CLK, address signals A18 to A2, precharge signals PRCVIN and PRCV and sense amplifier enable signal SENSEN are illustrated.

In the drawing, the sense amplifier enable signal SENSEN described in the above embodiment corresponds to CASE1.

That is, the sense amplifier enable signal SENSEN is asserted at time t2 (raised to the high level) and negated (dropped to the low level) earlier than time t3. However, it is only required that the sense amplifier enable signal SENSEN be asserted a given interval after time t1 at which the precharge signal PRCV is negated and negated before time t3 at which the precharge signal PRCV is asserted. Thus, the sense amplifier enable signal SENSEN may be a signal which, like the precharge signal PRCV, is negated at time t3, as shown as CASE2 in FIG. 7.

However, it is not desired that, even when the sense amplifier enable signal SENSEN is asserted while the precharge signal is being negated (the interval from t1 to t3), the sense amplifier enable signal be negated after time t3 as in CASE3. This is because malfunctions of circuits other than the sense amplifier may be induced. Of course, it is not desired that the sense amplifier enable signal SENSEN be asserted after time t3 as in CASE4.

Figure 8A:
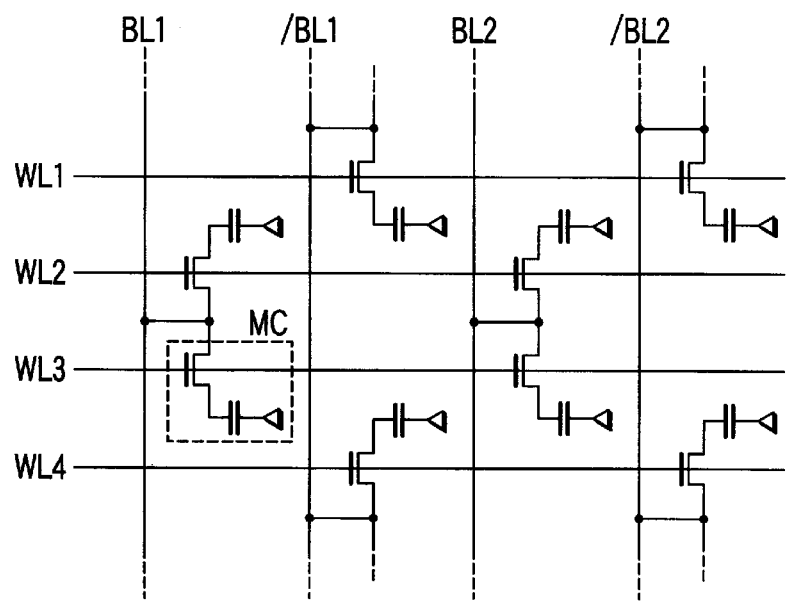
FIGS. 8A and 8B are circuit diagrams of memory cell arrays of the flash memory according to the embodiment of the present invention.
Figure 8B:
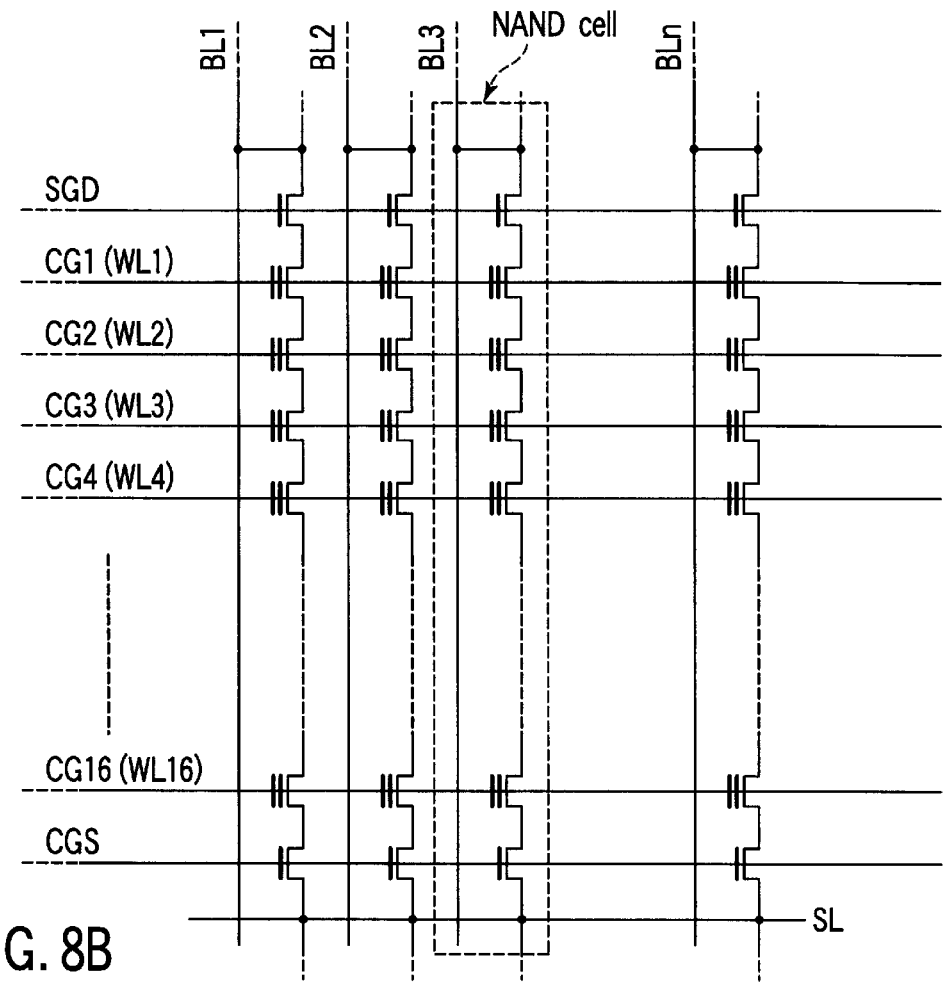
Figure 8C:
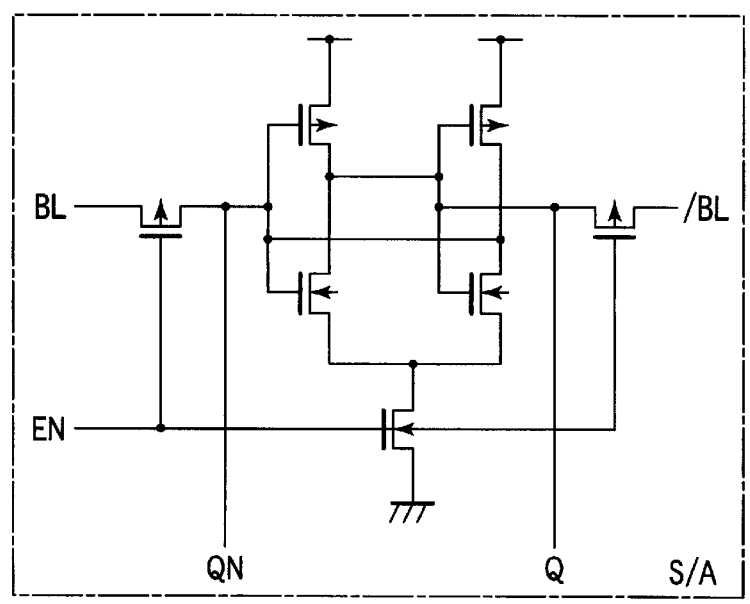
FIG. 8C is a circuit diagram of a sense amplifier of the flash memory according to the embodiment of the present invention.

According to the flash memory of the above embodiment of the present invention, there is provided a semiconductor storage device which can effect the stabilization of the memory sense operation and a reduction in power dissipation and reduce the time required for a leakage test. Of course, the above embodiment is not only one embodiment of the present invention and other embodiments are possible. That is, the flash memory according to the embodiment is simply configured to disable the sense amplifier at the mode of reading data into the sense amplifier, inhibit data entry into the sense amplifier when enabling the sense amplifier, and allow the sense amplifier to be enabled arbitrarily by an external input signal at leakage test mode. Thus, the circuit arrangement therefor is not necessarily limited to the circuit arrangements described above. Moreover, although the embodiment has been described in terms of an NOR type of flash memory, this is not restrictive. FIGS. 8A and 8B show circuit arrangements of memory cell arrays in a DRAM and a NAND type of EEPROM, respectively. The above embodiment can be used widely in flash memories of NAND type and semiconductor memories such as DRAMs. In addition, as shown in FIG. 8C, one input of the sense amplifier S/A may be connected to the bit line /BL instead of the reference voltage RF.

Figure 8D:
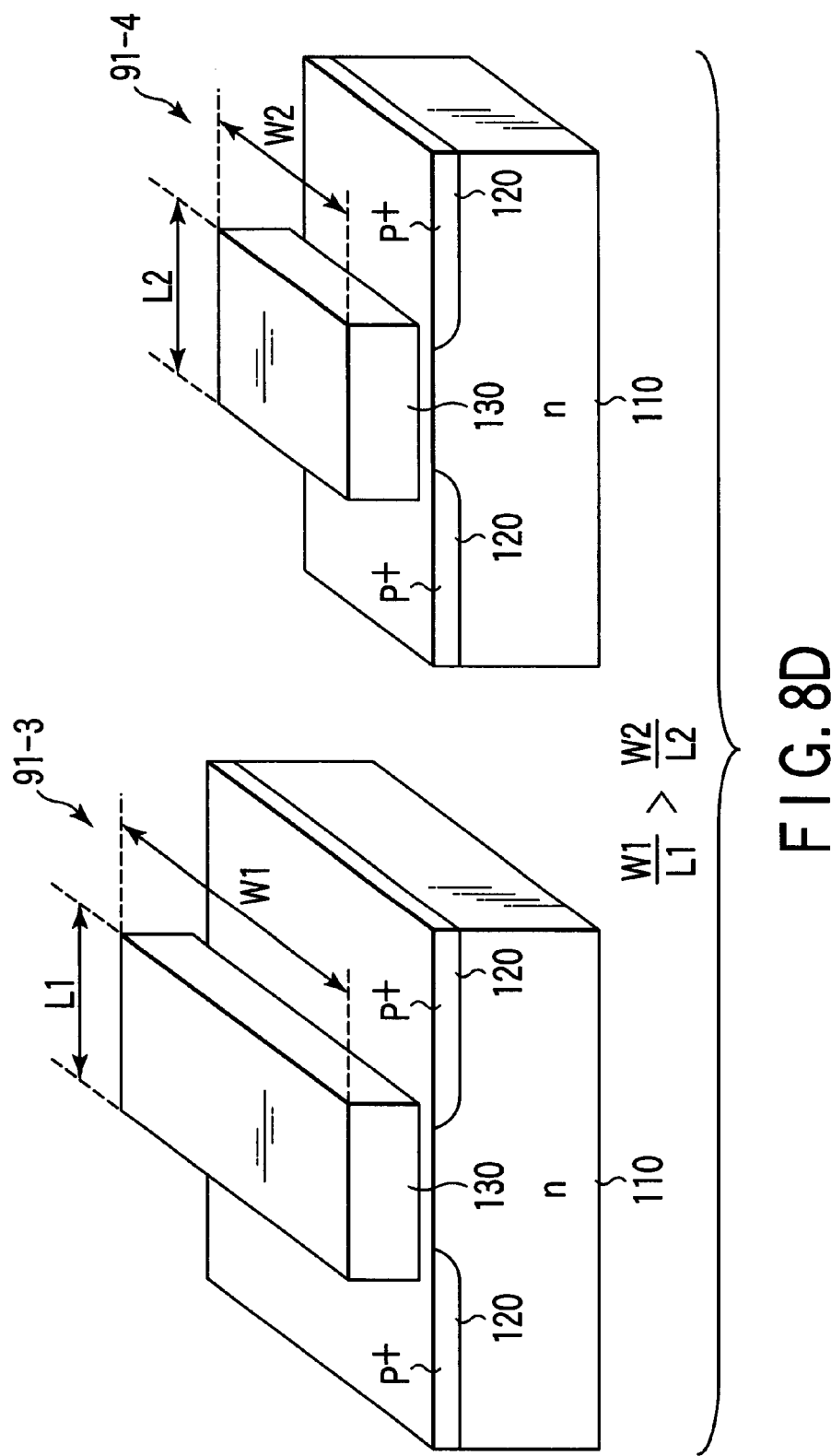
FIG. 8D is perspective views of MOS transistors which may be used in the sense amplifier of the flash memory according to the embodiment of the invention.

Furthermore, in order to improve the operational reliability of the sense amplifier, it is advisable to make the current drivability of the pMOS transistor 91-3 greater than that of the pMOS transistor 91-4. This point will be described with reference to FIG. 8D, which depicts, in perspective view, the pMOS transistors 91-3 and 91-4.

As shown, each of the pMOS transistors 91-3 and 91-4 has source/drain regions 120 formed in the surface of an n-type region 110 in a semiconductor substrate and a gate electrode 130 formed above the n-type region 110. The pMOS transistors 91-3 and 91-4 are related by $$W1/L1 > W2/L2$$

where W1 and L1 are the gate width and gate length, respectively, of the pMOS transistor 91-3 and W2 and L2 are the gate width and gate length, respectively, of the pMOS transistor 91-4. Thus, making the pMOS transistor 91-3 larger in size than the pMOS transistor 91-4 allows the current drivability (capacity to drive a current) of the pMOS transistor 91-3 to be improved.

The resulting effect will be explained below with reference to FIG. 5J. Assume here that, as a result of data having been read out of a memory cell, a low-level potential is input to the input terminal VIN and moreover this low-level potential is higher than the reference voltage RF input to the reference voltage input terminal VREF.

Since the read data potential is higher than the reference voltage RF immediately after the start of operation of the sense amplifier S/A, the nMOS transistor 92-1 is about to go into the on state. This will also cause the pMOS transistor 91-4 to be about to go into the on state. The current supplied by the pMOS transistor 91-4 will cause the potential at the node connected to the output terminal QN to be about to go to the high level.

However, immediately after the start of operation of the sense amplifier S/A, there is a slight difference between the gate potential (read data potential) of the pMOS and nMOS transistors 91-3 and 92-1 and the reference voltage RF. Thus, the pMOS transistor 91-3 is not rendered fully nonconductive, supplying a very low current. This current supplied by the pMOS transistor 91-3 will cause the nMOS transistor 92-2 to be about to go into the on state, which in turn causes the node connected to the output terminal QN to be about to go to the low level.

The pMOS transistor 91-3 provides a larger amount of current than the pMOS transistor 91-4 because the former is larger in size than the latter. That is, the action of the current supplied by the pMOS transistor 91-3 becomes predominant in comparison with the action of the current supplied by the pMOS transistor 91-4. As a result, the nMOS transistor 92-2 becomes rendered fully conductive, allowing the low-level output to appear at the output terminal QN.

Thus, making the pMOS transistor 91-3 larger in size than the pMOS transistor 91-4 allows these transistors to function as pull-up transistors. As a result, malfunctions of the sense amplifier S/A can be prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended clams and their equivalents.

What is claimed is:

1. A semiconductor memory device comprising:
   a memory cell array having an array of a plurality of memory cells;
   a read control circuit which produces a precharging signal to precharge a bit line of the memory cell array;
   a row decoder which selects a word line of the memory cell array;
   a column decoder which selects the bit line of the memory cell array;
   a sense amplifier which amplifies data read from a memory cell selected by the row decoder and the column decoder to the bit line; and
   a sense amplifier control circuit which is responsive to the precharging signal to control the sense amplifier, in reading data from a memory cell, the sense amplifier control circuit enabling the sense amplifier and inhibiting entry of read data from the memory cell into the sense amplifier only for a fixed interval after a fixed time after the precharging signal has been negated and allowing entry of the read data into the sense amplifier while the sense amplifier is being disabled.

2. The semiconductor memory device according to claim 1, further comprising a reference voltage generating circuit which generates a reference voltage applied to the sense amplifier when the precharging signal is negated, and wherein the sense amplifier control circuit inhibits entry of the reference voltage into the sense amplifier in enabling the sense amplifier.

3. The semiconductor memory device according to claim 1, wherein the sense amplifier control circuit outputs a sense amplifier enable signal to enable the sense amplifier, and
   the sense amplifier comprises a first transfer gate transistor of first conductivity type which includes a gate applied with the sense amplifier enable signal, one end of a current path connected to the bit line and other end of the current path; and
   a switching transistor of second conductivity type which includes a gate applied with the sense amplifier enable signal and controls the enabled/disabled state of the sense amplifier,
   in a state where the sense amplifier enable signal has been negated, the sense amplifier being allowed to receive the data by the first transfer gate transistor being opened and being disabled by the switching transistor being closed,
   in a state where the sense amplifier enable signal has been asserted, the sense amplifier being disallowed to receive the data by the first transfer gate transistor being closed and being enabled by the switching transistor being opened.

4. The semiconductor memory device according to claim 2, wherein the sense amplifier control circuit outputs a sense amplifier enable signal to enable the sense amplifier, and
   the sense amplifier comprises a first transfer gate transistor of first conductivity type which includes a gate applied with the sense amplifier enable signal, one end of a current path connected to the bit line and other end of the current path;
   a second transfer gate transistor of the first conductivity type which includes a gate applied with the sense amplifier enable signal, one end of a current path applied with the reference voltage and other end of the current path; and
   a switching transistor of second conductivity type which includes a gate applied with the sense amplifier enable signal, one end of a current path and other end of the current path, the switching transistor controlling the enabled/disabled state of the sense amplifier,
   in a state where the sense amplifier enable signal has been negated, the sense amplifier being allowed to receive the data and the reference voltage by the first and second transfer gate transistors being opened and being disabled by the switching transistor being closed,
   in a state where the sense amplifier enable signal has been asserted, the sense amplifier being disallowed to receive the data and the reference voltage by the first and second transfer gate transistors being closed and being enabled by the switching transistor being opened.

5. The semiconductor memory device according to claim 4, wherein the sense amplifier further comprises a first transistor of the first conductivity type including a gate connected to the other end of the current path of the first transfer gate transistor, one end of a current path connected to a power source potential and other end of the current path connected to the other end of the current path of the second transfer gate transistor;
   a second transistor of the second conductivity type including a gate connected to the other end of the current path of the first transfer gate transistor, one end of a current path connected to the other end of the current path of the first transistor and other end of the current path connected to the one end of the current path of the switching transistor;

a third transistor of the first conductivity type including a gate connected to the other end of the current path of the first transistor and the other end of the current path of the second transfer gate transistor, one end of a current path connected to the power source potential and other end of the current path connected to the gates of the first and second transistors, the third transistor pulling up read data from the memory cell input through the first transfer gate transistor when the sense amplifier is being disabled; and a fourth transistor of the second conductivity type including a gate connected to the gate of the third transistor and one end of a current path connected to the other end of the current path of the third transistor and other end of the current path connected to one end of the current path of the switching transistor.

6. The semiconductor memory device according to claim 1, further comprising a flip-flop which follows the sense amplifier to hold the data amplified by the sense amplifier.

7. The semiconductor memory device according to claim 4, further comprising an RS flip-flop which includes set and reset input terminals connected to the other ends of the current paths of the first and second transfer gate transistors, respectively.

8. The semiconductor memory device according to claim 1, wherein the sense amplifier control circuit enables the sense amplifier only for the interval when the precharge signal is negated.

9. The semiconductor memory device according to claim 1, wherein the sense amplifier control circuit produces a sense amplifier enable signal to enable the sense amplifier in response to the precharge signal and a leakage test signal which is asserted in testing as to the presence or absence of leakage in the memory cell, the sense amplifier enable signal being controlled only by one of the precharge signal and the leakage test signal when the other is fixed at a predetermined level.

10. The semiconductor memory device according to claim 9, wherein the leakage test signal has been asserted all the time and the sense amplifier control circuit asserts the sense amplifier enable signal when the precharge signal is negated, during the memory cell read operation and the precharge signal has been negated all the time and the sense amplifier control circuit asserts the sense amplifier enable signal when the leakage test signal is asserted, during the memory cell leakage test operation.

11. The semiconductor memory device according to claim 10, wherein, at the memory cell leakage test operation, the sense amplifier control circuit enables the sense amplifier and inhibits entry of the data into the sense amplifier only for a fixed interval after a fixed time after the leakage test signal has been asserted and allows entry of the data into the sense amplifier while the sense amplifier is being disabled.

12. The semiconductor memory device according to claim 11, further comprising a reference voltage generating circuit which generates a reference voltage to be applied to the sense amplifier when the leakage test signal is asserted at the memory cell leakage test operation, and wherein the sense amplifier control circuit inhibits entry of the reference voltage into the sense amplifier in enabling the sense amplifier.

13. The semiconductor memory device according to claim 9, wherein the sense amplifier control circuit comprises a NAND gate which performs a logical NAND operation on the precharge signal and the leakage test signal;

a first delay circuit which delays the output signal of the NAND gate by a predetermined time;

a second delay circuit which delays the output signal of the output signal of the first delay circuit by a predetermined time;

a first inverter which inverts the output signal of the NAND gate;

a second inverter which inverts the output signal of the first delay circuit; and an AND gate which performs a logical AND operation on the output signals of the second delay circuit and the first and second inverters to produce the sense amplifier enable signal.

14. The semiconductor memory device according to claim 1, wherein the memory cell is flash cell comprising a stacked-gate structure.

15. The semiconductor memory device according to claim 3, wherein the sense amplifier enable signal is asserted only for an interval when the precharge signal is negated.

16. The semiconductor memory device according to claim 4, wherein the sense amplifier enable signal is asserted only for an interval when the precharge signal is negated.

17. The semiconductor memory device according to claim 9, wherein the sense amplifier enable signal is asserted, at memory cell data read operation, only for an interval when the precharge signal is negated and, at leakage test operation, only for an interval when the leakage test signal is asserted.

18. The semiconductor memory device according to claim 5, wherein the current drivability of the first transistor is larger than that of the third transistor.

19. The semiconductor memory device according to claim 5, wherein the first and third transistors are related by $W1/L1 > W2/L2$ where W1 and L1 are the gate width and gate length, respectively, of the first transistor and W2 and L2 are the gate width and gate length, respectively, of the third transistor.

* * * * *